United States Patent
Jeng

(10) Patent No.: US 6,303,490 B1
(45) Date of Patent: Oct. 16, 2001

(54) METHOD FOR BARRIER LAYER IN COPPER MANUFACTURE

(75) Inventor: Pei-Ren Jeng, Hsinchu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/500,636

(22) Filed: Feb. 9, 2000

(51) Int. Cl.⁷ ................................................. H01L 21/4763
(52) U.S. Cl. ..................... 438/627; 438/643; 438/648; 438/653; 438/656; 438/685; 438/687
(58) Field of Search ..................................... 438/653–654, 438/656, 618, 622, 627–629, 633, 637–640, 643–645, 648, 667–668, 672–673, 678, 681, 685, 687

(56) References Cited

U.S. PATENT DOCUMENTS

| | | | |
|---|---|---|---|
| 5,882,399 | * | 3/1999 | Ngan et al. .............................. 117/89 |
| 5,985,759 | * | 11/1999 | Kim et al. ............................. 438/653 |
| 6,045,666 | * | 4/2000 | Satitpunwaycha et al. .... 204/192.17 |
| 6,059,940 | * | 5/2000 | Nogami et al. ................. 204/192.15 |
| 6,140,229 | * | 10/2000 | Sumi ..................................... 438/653 |

FOREIGN PATENT DOCUMENTS

40920509 * 8/1997 (JP) ........................... H01L/21/3205

* cited by examiner

*Primary Examiner*—Charles Bowers
*Assistant Examiner*—Thanh Nguyen

(57) ABSTRACT

A method for forming a barrier layer on a semiconductor substrate for the fabrication of a conductive layer of copper is disclosed. A double film of titanium and titanium nitride (Ti/TiN) is employed to serve as barrier layer. The titanium layer is formed by two-stage ionized metal plasma (IMP) sputtering. A wafer bias is provided at the first stage to get excellent bottom step coverage. No wafer bias is added at the second stage, and (002)-oriented texture of titanium is constructed. Over such a titanium liner structure, the titanium nitride barrier layer is formed with (111)-oriented texture. Finally, the copper layer is formed on the titanium nitride layer with (111) crystallographic orientation.

18 Claims, 3 Drawing Sheets

METHOD FOR BARRIER LAYER IN COPPER MANUFACTURE

FIELD OF THE INVENTION

The present invention relates to a semiconductor manufacture process, and more especially, to a method for forming a barrier layer

BACKGROUND OF THE INVENTION

For building an integrated circuit operating with desired action, it is necessary to fabricate many active devices on a single semiconductor substrate. Various kinds of devices with different functions, such as transistors, resistors and capacitors, are formed together. Today, we usually build hundreds of thousands of semiconductor devices on a single chip. Each of the devices on the substrate must be electrically isolated from the others to ensure their individual function, and, specific devices must be electrically interconnected so as to implement the whole desired circuit function.

In order to construct the interconnection and contact among all the active devices, a metallization process is employed. At an early stage, single layer metallization process provides all the designed connection. But, as the integrated circuit technology trend towards increase of the integration and decrease of the device size, the surface of the chip cannot provide enough area to build all the interconnects needed. It must be designed more than one level of interconnects. The multilevel-interconnect technology is thus developed to meet this demand.

In the development of interconnect technology, as the tendency is scaling down of the device, interconnect delay becomes the performance barrier for high-speed integrated circuits (IC's). The increased interconnect delay will reduce device speed and exaggerate the problem of high cross talk and power dissipation. Low resistivity interconnecting material and low dielectric constant insulator are therefore desired to reduce the increased interconnect delay. In the creation of metal interconnect lines and contact plugs or via plugs, copper is generally the preferred conductive material due to its low resistivity and high electromigration resistance. However, the application of copper suffers from some problems. Copper readily diffuses into commonly used dielectric material such as silicon oxide and oxygen-containing polymer. This can lead to severe corrosion of the copper and the dielectric material for the copper combining with oxygen. The corrosion may result in loss of adhesion, delamination, void, and ultimately a catastrophic failure of the component. A barrier layer is therefore required for copper manufacture process to prevent copper form diffusion.

Another considerable problem of copper manufacture is the effect of copper grain size in narrow interconnects, which has been studied as the semiconductor technology trends to increase the wafer integration and reduce the device dimension. It has been found that, as the ratio of the line width to the grain size decreases, the mean time to failure (MTTF) decreases to minimum and then increases exponentially, and the electromigration induced failure increases continuously. That means, fine grain structure of copper formed for highly integrated devices degrades both the electromigration lifetime and the mean time to failure (MTTF). To deal with such a situation, an electroplating process is employed for copper manufacture due to the relatively large grain structure of the electroplated copper.

In the applications of electroplating technique of copper, a copper seed layer is generally needed on the diffusion barrier layer for landing the electroplated copper. The microstructure of the electroplated copper is highly dependent on the characteristics of the underlying barrier and seed layer. Previous studies have reported on the impact on electromigration of copper films of (111) and (200) textured crystallographic orientation. These study has found that the electromigration lifetime of (111)-oriented copper film is much longer (about four times) than that of the (200)-oriented copper film under equal conditions of activation energy. This makes the copper manufacture face another problem about the poor (111)-oriented texture of copper on the conventional barrier material of titanium nitride, which is widely used in the aluminum barrier and has an advantage of good step coverage.

For getting good (111)-oriented texture of copper to achieve the desired performance, technology using another material for copper barrier is developed. A double film of tantalum and tantalum nitride is adopted to be the copper barrier layer because high wetting and highly (111)-oriented texture of copper film can then be obtained thereon. However, as the integration is continuously increased and the device dimension scaled down, the sputtered tantalum and tantalum nitride barrier film suffers from its poor step coverage. As the aspect ratio is raised in the highly integrated process, that can cause the device fail. A better barrier manufacture process is still required.

SUMMARY OF THE INVENTION

The present invention proposes a novel method to forming a barrier layer on a semiconductor substrate for the fabrication of a conductive layer of copper. Applying the method proposed by the present invention, a double film of titanium and titanium nitride (Ti/TiN) is employed to serve as barrier layer. The titanium layer is formed by two-stage ionized metal plasma (IMP) sputtering. At the first stage, a wafer bias is provided, and excellent bottom step coverage is achieved. At the second stage, no wafer bias is added, and (002)-oriented texture of titanium is constructed. Over such a titanium liner structure, the titanium nitride barrier layer is formed by a CVD process with (111)-oriented texture. Finally, the copper layer is formed by electroplating process on the titanium nitride layer, and a (111) crystallographic orientation of copper is obtained. With such a structure of copper, the electromigration lifetime is extended, and the reliability of interconnect is ensured.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention proposes a novel method for forming a barrier layer on a semiconductor substrate for the fabrication of a conductive layer of copper. This method utilized titanium nitride (TiN) as the barrier layer with an under layer of titanium (Ti). In addition, a two-step process for manufacturing the underlying titanium layer is employed to achieve better step coverage and better crystallographic orientation for overlying barrier layer of titanium nitride. The method described here includes many standard processes well known in the art like photolithography, etching chemical vapor deposition (CVD), or physical vapor deposition (PVD), which are not discussed in detail.

Figure 1:
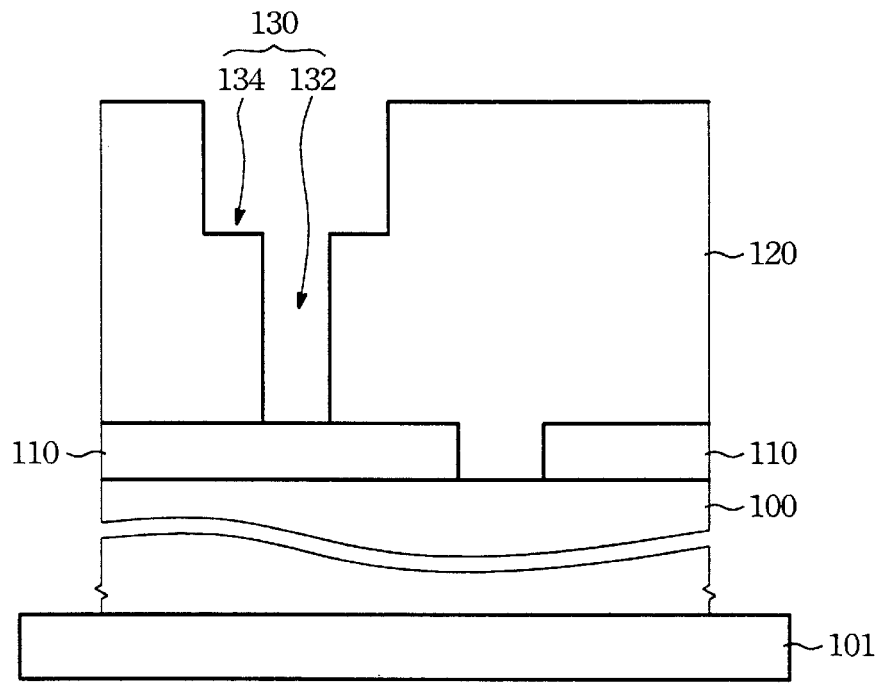
FIG. 1 is a cross-sectional view of a semiconductor wafer illustrating the step of providing a semiconductor substrate with underlying conductive layer, inter-layer dielectric and opening of plug and interconnect pattern formed thereon.

A preferred embodiment of the present invention is described as follows to form a interconnect layer with a contact or via plug in a dual damascene process using copper as the conductive material with a double film of titanium nitride and titanium (TiN/Ti) as the barrier layer. Referring to FIG. 1, a semiconductor substrate 100, wherein all the designed active devices are built, is provided and held on a susceptor 101. The conductive layer 110 represents electrodes of those designed active devices or an underlying interconnect layer. Those active devices, such as transistors, resistors and capacitors, are not shown in the following figures for the cross-sectional view of the semiconductor substrate. Without limiting the spirit and the scope of the present invention, only the metallization processes and the profile of the plug and interconnect line are illustrated.

Over the conductive layer 110, a planarized inter-layer dielectric (ILD) 120 is deposited for providing the isolation between interconnect layer and active devices or between different interconnect layers. The inter-layer dielectric 120 is generally deposited using a conventional low pressure chemical vapor deposition (LPCVD), atmosphere pressure chemical vapor deposition (CVD), sub-atmosphere chemical vapor deposition (SACVD), plasma enhanced chemical vapor deposition (PECVD), or high density plasma chemical vapor deposition (HDPCVD). A spin-on coating can also be employed. An oxide material of tetra-ethyl-ortho-silicate-oxide (TEOS-oxide), ozone TEOS-oxide, boro-phospho silicate glass (BPSG), phospho silicate glass (PSG), boro silicate glass, (BSG), undoped silicate glass (USG) or silicon-rich oxide (SRO), and so on, can be employed for this inter-layer dielectric 120. Materials with lower dielectric constant, such as fluorine-doped silicon oxide (or named fluorosilicate Glass, FSG) or hydrogen silsesquioxane (HSQ), are another choices for this dielectric. The fluorine-doped silicon oxide can be formed with chemical vapor deposition such as HDPCVD or PECVD, and the hydrogen silsesquioxane is formed with spin-on glass process.

In the inter-layer dielectric 120, an opening 130 with plug pattern 132 and interconnect-line pattern 134 are formed in sequence. In general, a first photolithography followed by a first anisotropic etching are employed to open the interconnect-line pattern 134. A second photolithography and a second anisotropic etching follow to open the plug pattern 132 beneath the interconnect-line pattern 134. In a specific embodiment, a stop layer for the first anisotropic etching can be optionally disposed in the inter-layer dielectric 120 at the level between the interconnect line 134 and the plug 132. Another modification to form this opening 130 can alternatively be adopted.

In the opening of the plug pattern and the interconnect-line pattern, a titanium layer 140 is firstly formed. The titanium layer 140 comprises two sub-layer 140a and 140b, which are formed with a two-stage physical vapor deposition process of ionized metal plasma (IMP) sputtering described as follows.

Figure 2:
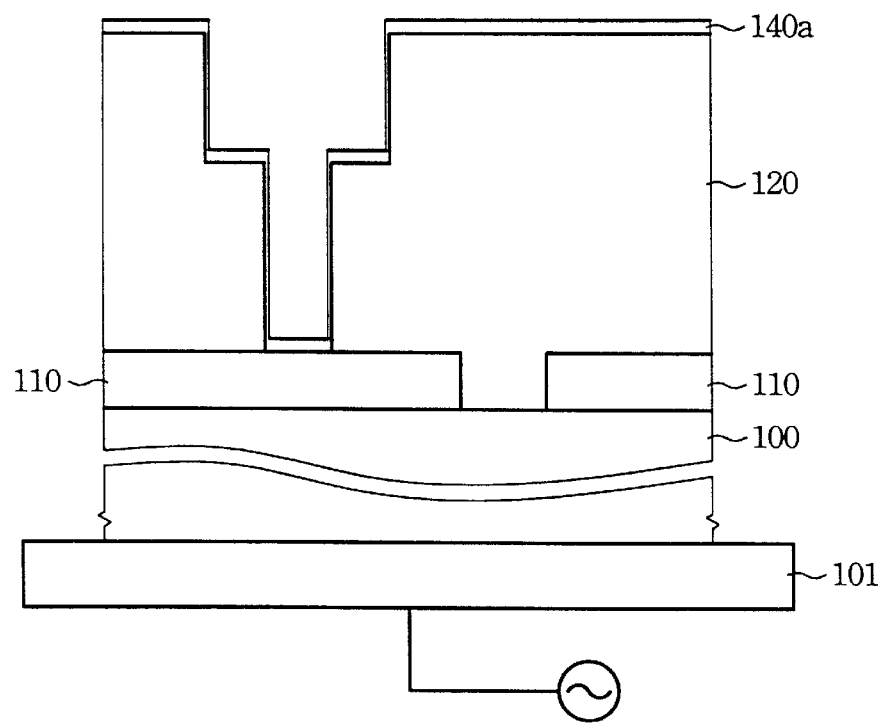
FIG. 2 is a cross-sectional view of a semiconductor wafer illustrating the step of depositing a first titanium sub-layer using biased IMP sputtering.

At the first stage of the titanium deposition process as illustrated in FIG. 2, a physical vapor deposition of first IMP sputtering is carried out. A certain wafer bias is provided on the susceptor 101 of the substrate 100 during the first deposition stage of the titanium layer. The provided bias is employed to enhance the performance of the step coverage. The ionized metal plasma sputtering is an anisotropic deposition process using DC/RF coupled plasma, and often used for deposition of barrier or liner materials within contacts with high aspect ratio to get good bottom step coverage. When the wafer bias is applied during deposition, the bottom step coverage is further improved due to higher directionality of ionized metal atoms. The first sub-layer of titanium 140a will be deposited with thickness much thicker on the bottom of the contact than on the sidewalls. In a preferred embodiment, the wafer bias can be applied to the susceptor 101 by using a radio frequency power supply. In a further embodiment, the radio frequency power supply can be adopted, for example, with frequency of about 400 kHz, and the power applied to the susceptor 101 can vary until 300 W.

In general, the higher the wafer bias is applied to the susceptor 101, the better step coverage is achieved. However, the adding of the wafer bias increases the energy of the ionized metal atoms, and the energetic ion bombardment on growing film change the film properties. The crystallographic orientation of the titanium sub-layer 140a is changed from orientation (002), which is the preferred one for the subsequent grown titanium nitride film, to orientation (101), which is undesired to be the liner texture of titanium nitride barrier for copper. Therefore, a second sub-layer of titanium 140b is adopted subsequently.

Figure 3:
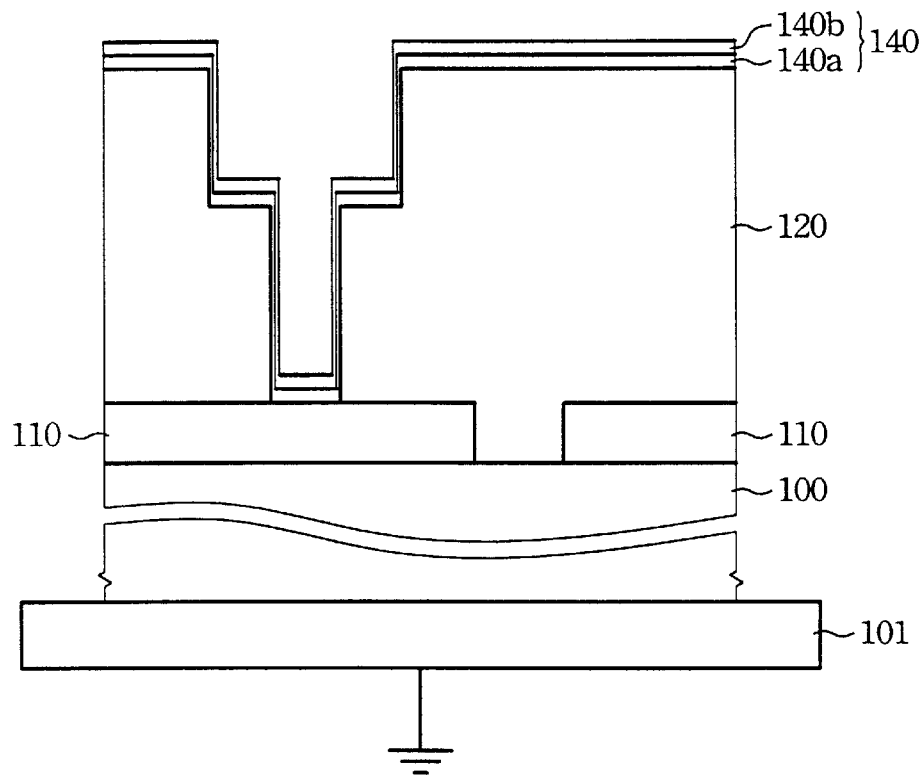
FIG. 3 is a cross-sectional view of a semiconductor wafer illustrating the step of depositing a second titanium sub-layer using IMP sputtering without wafer bias.

Referring to FIG. 3, a second stage of the titanium deposition process follows after the first stage. A physical vapor deposition of second IMP sputtering is employed, and the titanium layer 140 is consecutively deposited with the second sub-layer of titanium 140b formed on the first sub-layer of titanium 140a. Different from the one performed at the first stage, the second IMP sputtering is carried out while susceptor 101 is grounded, and no wafer bias is added. Without wafer bias applied to the susceptor 101, the second sub-layer of titanium 140b is deposited with much smoother surface morphology and lower defect density, and more important, a highly (002)-oriented texture is exhibited.

Figure 4:
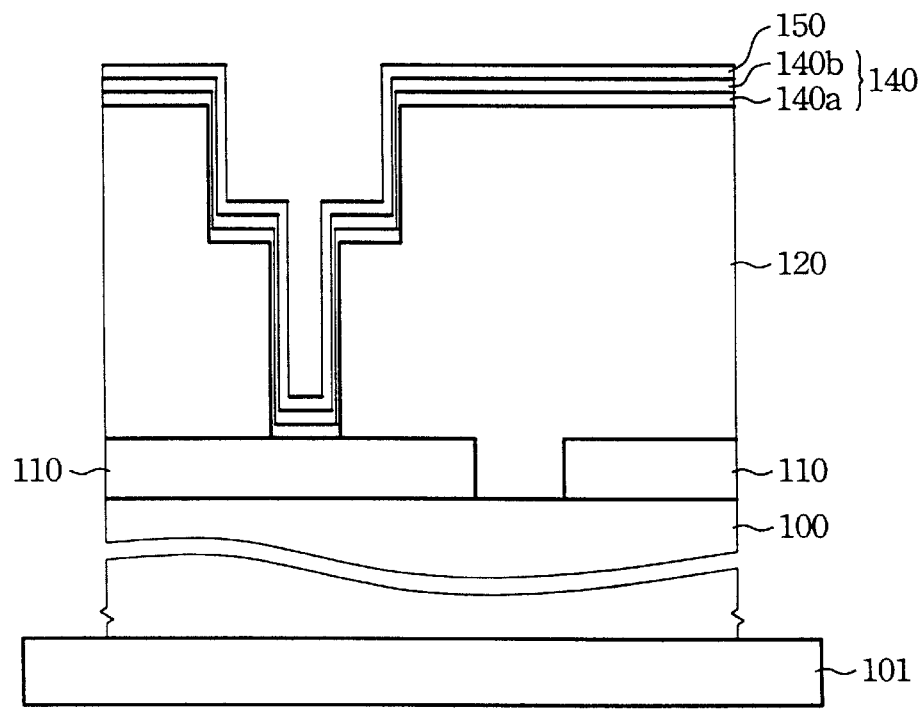
FIG. 4 is a cross-sectional view of a semiconductor wafer illustrating the step of depositing a titanium nitride layer using CVD.

After the sub-layer 140b is formed, and the titanium layer 140 is completed with good surface texture of (002) crystallographic orientation, a titanium nitride (TiN) layer 150 is then formed on the titanium layer 140. In a preferred embodiment, the titanium nitride layer 150 is deposited with a chemical vapor deposition (CVD), for example, with metal organic chemical vapor deposition (MOCVD). The cross-sectional view of titanium nitride (TiN) layer 150 on the wafer is illustrated in FIG. 4. The titanium nitride layer 150 serves as a barrier layer for the subsequent interconnect layer of copper. Landing on the highly (002)-oriented titanium layer 140, the titanium nitride layer 150 will be formed with highly (111)-oriented texture. The titanium has an atom distance between atoms in (002) plane of about 2.95 angstroms, which is nearly equal to the distance between atoms in (111) plane of titanium nitride, wherein the latter one is about 3.00 angstroms. This makes the (002)-oriented liner titanium considered to enhance the crystallographic orientation (111) of titanium nitride layer 150. With enhanced (111) crystallographic orientation of titanium nitride layer 150, the overlying conductive layer can be formed with (111)-oriented copper.

Figure 5:
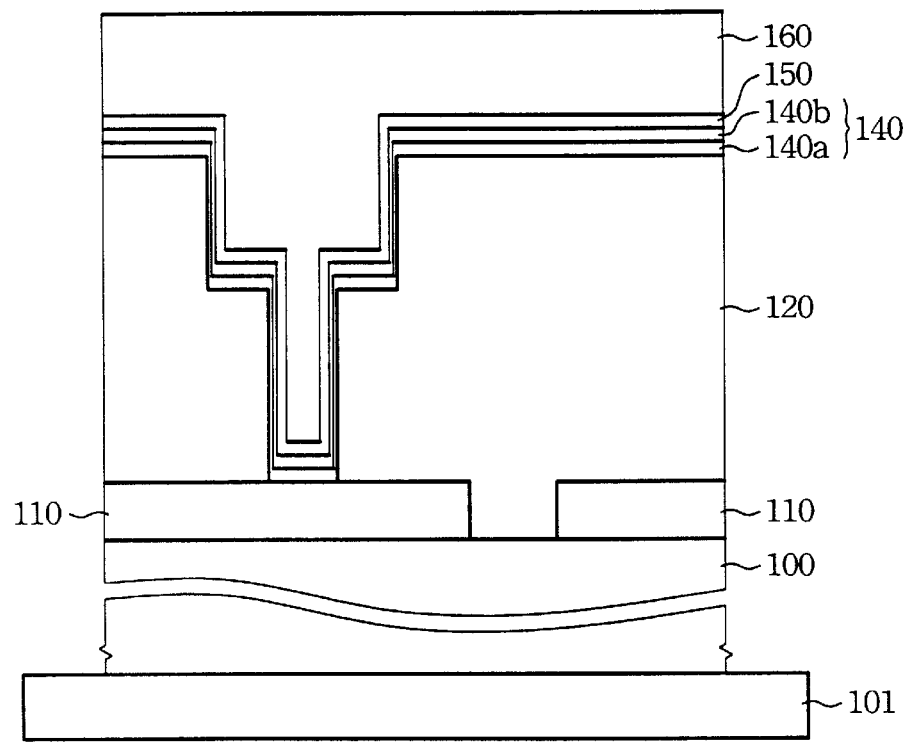
FIG. 5 is a cross-sectional view of a semiconductor wafer illustrating the step of forming a copper layer using electroplating process.

Thereafter, a copper layer 160 is formed on the titanium nitride layer 150 and fills the opening 130 of the plug pattern and the interconnect-line pattern as shown in FIG. 5. An electroplating process is preferred for the creation of this copper layer 160 to get a relatively large grain structure. As mentioned above, a copper seed layer is generally needed on the barrier layer 150 of titanium nitride prior to the electroplating process for landing the electroplated copper. The copper seed layer can be formed by a physical vapor deposition (PVD). The electroplated copper layer together with the copper seed layer construct the copper layer 160 and are regarded as a whole without showing individual profile in the figures. With underlying enhanced (111)-oriented titanium nitride layer 150, the copper layer 160 can be formed with (111)-oriented texture, which is the preferred crystallographic orientation for copper due to the long electromigration lifetime it can get. The device performance is thus improved.

Figure 6:
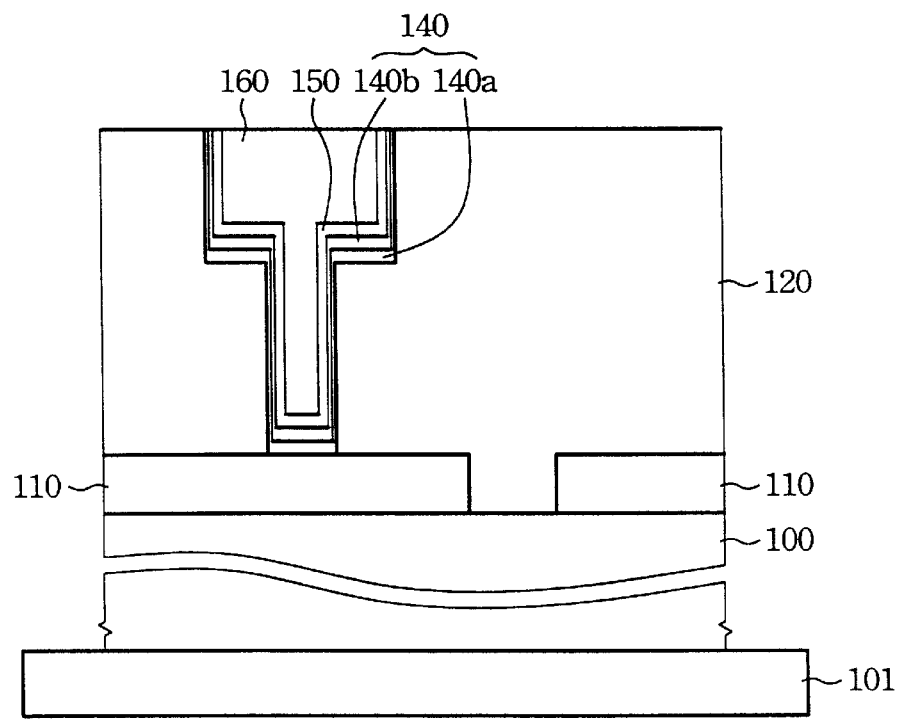
FIG. 6 is a cross-sectional view of a semiconductor wafer illustrating the step of performing an etching back to remove a portion of the copper layer exceeding the opening.

Finally, referring to FIG. 6, to complete the manufacture of a dual damascene interconnect, a process of etching back is performed to remove a portion of the copper layer 160 which exceed the opening 130. The preferable method for this step can be chemical mechanical polishing (CMP) process for the global planarization that it can provide. The interconnecting copper layer with plug is thus accomplished by a dual damascene process with a planarized surface.

Applying the method proposed by the present invention, a conductive layer of copper is fabrication with double film of titanium and titanium nitride (Ti/TiN) serving as barrier layer. The underlying titanium layer 140 can meet both requirements of bottom step coverage and (002)-oriented texture by using the two-stage IMP process. The (002)-oriented texture of titanium layer 140 leads to a (111) crystallographic orientation of the titanium nitride layer 150. With (111)-oriented texture of titanium nitride barrier 150, the crystallographic orientation (111) of the copper layer 160 is delivered, the electromigration lifetime is extended, and the reliability of interconnect is ensured.

As is understood by a person who is skilled in the art, the foregoing preferred embodiments of the present invention are illustrated of the present invention rather than limiting of the present invention. It is intended to cover various modifications and similar arrangements included within the spirit and scope of the appended claims, such as applying the copper to another application other than the dual damascene process, or using different power supply other than the proposed one to provide the wafer bias. The scope of such modifications should be accorded the broadest interpretation so as to encompass all such modifications and similar structure.

What is claimed is:

1. A method of depositing a barrier layer on a semiconductor substrate, on said barrier layer a copper layer is formed, said method comprising:

performing a first ionized metal plasma sputtering to form a first titanium layer, with a high crystal (101)-oriented texture, on said semiconductor substrate, said first ionized metal plasma sputtering being performed with said semiconductor substrate biased;

performing a second ionized metal plasma sputtering to form a second titanium layer, with a highly crystal (002)-oriented texture, on said first titanium layer, said second ionized metal plasma sputtering being performed with said semiconductor substrate grounded; and forming a titanium nitride layer on said second titanium layer.

2. The method according to claim 1, wherein said semiconductor substrate is biased with a radio frequency power supply.

3. The method according to claim 2, wherein said radio frequency power supply is applied to a susceptor on which said semiconductor substrate is held.

4. The method according to claim 1, wherein said titanium nitride layer is formed with a chemical vapor deposition (CVD).

5. The method according to claim 4, wherein said chemical vapor deposition is a metal organic chemical vapor deposition (MOCVD).

6. A method for forming on a semiconductor substrate a barrier layer on which a copper layer is formed, said method comprising:

performing a first ionized metal plasma sputtering to form a first titanium layer, with a highly crystal (101)-oriented texture, on said semiconductor substrate, said first ionized metal plasma sputtering being performed with said semiconductor substrate biased;

performing a second ionized metal plasma sputtering to form a second titanium layer, with a highly crystal (002)-oriented texture, on said first titanium layer, said second ionized metal plasma sputtering being performed with said semiconductor substrate grounded; and forming a titanium nitride layer on said second titanium layer.

7. The method according to claim 6, wherein said semiconductor substrate is biased at said first ionized metal plasma sputtering with a radio frequency power supply.

8. The method according to claim 7, wherein said radio frequency power supply is applied to a susceptor on which said semiconductor substrate is held.

9. The method according to claim 6, wherein said titanium nitride layer is formed with a chemical vapor deposition (CVD).

10. The method according to claim 9, wherein said chemical vapor deposition is a metal organic chemical vapor deposition (MOCVD).

11. A method for forming a conductive layer of copper on a semiconductor substrate, said method comprising:

performing a first ionized metal plasma sputtering to form a first titanium layer, with a highly crystal (101)-oriented texture, on said semiconductor substrate, said first ionized metal plasma sputtering being performed with said semiconductor substrate biased;

performing a second ionized metal plasma sputtering to form a second titanium layer, with a highly crystal (002)-oriented texture, on said first titanium layer, said second ionized metal plasma sputtering being performed with said semiconductor substrate grounded;

forming a titanium nitride layer on said second titanium layer; and forming a copper layer on said titanium nitride layer.

12. The method according to claim 11, wherein said semiconductor substrate is biased at said first ionized metal plasma sputtering with a radio frequency power supply.

13. The method according to claim 12, wherein said radio frequency power supply is applied to a susceptor on which said semiconductor substrate is held.

14. The method according to claim 11, wherein said titanium nitride layer is formed with a chemical vapor deposition (CVD).

15. The method according to claim 14, wherein said chemical vapor deposition is a metal organic chemical vapor deposition (MOCVD).

16. The method according to claim 11, wherein said copper layer is formed by an electroplating process.

17. The method according to claim 16 further comprising a step to form a copper seed layer on said titanium nitride layer prior to said electroplating process.

18. The method according to claim 17, wherein said copper seed layer is formed on said titanium nitride layer by a physical vapor deposition (PVD).

* * * * *